United States Patent
Chen et al.

(10) Patent No.: US 10,777,516 B2
(45) Date of Patent: Sep. 15, 2020

(54) FAN-OUT ANTENNA PACKAGING STRUCTURE AND PACKAGING METHOD

(71) Applicant: SJ Semiconductor (Jiangyin) Corporation, Jiangyin (CN)

(72) Inventors: Yenheng Chen, Jiangyin (CN); Chengchung Lin, Jiangyin (CN); Chengtar Wu, Jiangyin (CN)

(73) Assignee: SJ SEMICONDUCTOR (JIANGYIN) CORPORATION, Jiang Yin (CN)

( * ) Notice: Subject to any disclaimer, the term of this patent is extended or adjusted under 35 U.S.C. 154(b) by 0 days.

(21) Appl. No.: 16/267,061

(22) Filed: Feb. 4, 2019

(65) Prior Publication Data
US 2020/0058604 A1    Feb. 20, 2020

(30) Foreign Application Priority Data

Aug. 20, 2018 (CN) .......................... 2018 1 0949023
Aug. 20, 2018 (CN) .......................... 2018 2 1346487

(51) Int. Cl.
*H01L 23/66* (2006.01)
*H01L 23/00* (2006.01)
*H01Q 1/24* (2006.01)
*H01L 23/538* (2006.01)

(52) U.S. Cl.
CPC .......... *H01L 23/66* (2013.01); *H01L 23/5385* (2013.01); *H01L 23/5386* (2013.01); *H01L 24/14* (2013.01); *H01L 24/95* (2013.01); *H01Q 1/243* (2013.01)

(58) Field of Classification Search
None
See application file for complete search history.

(56) References Cited

U.S. PATENT DOCUMENTS

2018/0166405 A1* 6/2018 Chiang .................. H01L 24/82
2018/0366347 A1* 12/2018 Chuang ................ H01L 21/561
2020/0105687 A1* 4/2020 Wang ..................... H01L 24/19

* cited by examiner

*Primary Examiner* — Khaja Ahmad
(74) *Attorney, Agent, or Firm* — Alston & Bird LLP

(57) ABSTRACT

The present disclosure provides a fan-out antenna packaging structure for a semiconductor chip and its fabricating method. The structure is a stacked-up two sets of metal connecting columns and antenna metal patterns arranged in two sequential layers of packaging materials. In some applications there can be more than two sets of the stacked-up antenna structures, fabricated around the chip at one side of a rewiring layer. The chip is interconnected to external metal bumps on the other side of the rewiring layer.

7 Claims, 5 Drawing Sheets

FAN-OUT ANTENNA PACKAGING STRUCTURE AND PACKAGING METHOD

CROSS REFERENCES TO RELATED APPLICATIONS

This application claims the benefits of priority to Chinese Patent Application No. CN 2018109490235, entitled "Fan-Out Antenna Packaging Structure and Packaging Method", filed with SIPO on Aug. 20, 2018, the contents of which are incorporated herein by reference in its entirety.

TECHNICAL FIELD

The present disclosure relates to the field of semiconductor packaging, and in particular, to a fan-out antenna packaging structure and a packaging method.

BACKGROUND

Integrated circuit packaging aims at obtaining packaging structures that are cheaper, more reliable, faster and have a higher packaging density. In the future, the integrated circuit density of various electronic devices will be improved by continuously reducing minimum feature sizes. At present, common packaging methods include Wafer Level Chip Scale Packaging (WLCSP), Fan-Out Wafer Level Package (FOWLP), Flip Chip, Package on Package (POP), and the like. With a large number of input/output (I/O) ports and good integration flexibly, the FOWLP has become one of the advanced packaging methods at present.

Increased demands for these popular high-tech electronic products have enabled more functions and applications configured into these high-tech products. In addition, to meet the need for mobilization, the function of wireless communication is provided.

In general, existing antenna structures in IC devices usually have many types, for examples, they are dipole antenna, monopole antenna, patch antenna, planar inverted-F antenna, meander line antenna, inverted-L antenna, loop antenna, spiral antenna and spring antenna. A known practice is to manufacture an antenna directly on the surface of a circuit board. By this practice, an antenna occupies an extra space of the circuit board, thereby resulting in a low integration level to the chip. For various electronic devices, a large circuit board means a large size. However, the main purpose of designing and developing these electronic devices is to allow users to carry them easily. Therefore, how to reduce the area of the circuit board occupied by an antenna, and improve the integration performance of an antenna packaging structure is the key to solve the problems of these electronic devices.

Based on the above, it is necessary to provide a packaging structure and packaging method for solving the problem caused by antenna occupying too much area of a circuit board.

SUMMARY

The present disclosure describes a fan-out antenna packaging structure for a semiconductor chip and its fabricating method. The structure is a stacked-up two sets of metal connecting columns and antenna metal patterns arranged in two sequential layers of packaging materials. In some applications there can be more than two sets of the stacked-up antenna structures, fabricated around the chip at one side of a rewiring layer. The chip is interconnected to external metal bumps on the other side of the rewiring layer.

The present disclosure provides a fan-out antenna structure on a semiconductor chip, including: a rewiring layer which has a first surface and a second surface opposite to the first surface, wherein the semiconductor chip electrically connects to the second surface of the rewiring layer; a plurality of first metal connecting columns, disposed on the second surface of the rewiring layer and electrically connected to the rewiring layer; a first packaging layer, disposed on the second surface of the rewiring layer, exposing top surfaces of the plurality of first metal connecting columns and a top surface of the semiconductor chip; an adhesive layer disposed on the top surface of the semiconductor chip; a first antenna metal layer, patterned to electrically connect to the plurality of first metal connecting columns; a plurality of second metal connecting columns, disposed on and electrically connected to the first antenna metal layer; a second packaging layer, disposed on the first packing layer, exposing top surfaces of the plurality of second metal connecting columns; a second antenna metal layer, patterned to electrically connect to the plurality of second metal connecting columns; and a plurality of metal bumps, disposed on the first surface of the rewiring layer.

Optionally, the semiconductor chip further comprises a chip external port connected to a contact solder pad, and the chip external port comprises one of a metal column and a metal ball.

Optionally, surfaces of the chip external ports are surrounded by the rewiring layer.

Optionally, the adhesion layer comprises one of an epoxy resin layer and a polymer film layer.

Optionally, a first metal connecting block provided between each of the plurality of first metal connecting columns and the first antenna metal layer, wherein the first metal connecting block has a larger contacting surface than a contacting surface of said first metal connecting column; and a second metal connecting block provided between each of the plurality of second metal connecting columns and the second antenna metal layer, wherein the second metal connecting block has a larger contacting surface than a contacting surface of said second metal connecting column.

Optionally, the first packaging layer comprises one of an epoxy resin layer, a polyimide layer and a silica gel layer; and the second packaging layer comprises one of an epoxy resin layer, a polyimide layer and a silica gel layer.

Optionally, the rewiring layer comprises a patterned dielectric layer and a patterned metal wiring layer aligned with the patterned dielectric layer.

Optionally, the patterned dielectric layer comprises one or a combination of an epoxy resin layer, a silica gel layer, a PI layer, a PBO layer, a BCB layer, a silicon oxide layer, a phosphorosilicate glass layer, and a fluorine-containing glass layer, and the metal wiring layer comprises one or a combination of a copper layer, an aluminum layer, a nickel layer, a gold layer, a silver layer, and a titanium layer.

Optionally, the material of the plurality of metal bumps comprises one of copper, nickel, tin and silver.

The present disclosure further provides a method of fabricating a fan-out antenna for a semiconductor chip, comprising the following steps: S1: providing a supporting substrate, and forming a separation layer on the supporting substrate; S2: forming a second antenna metal layer on the separation layer; S3: forming a plurality of second metal connecting columns on the second antenna metal layer; S4: depositing a second packaging layer on the second antenna metal layer and the plurality of second metal connecting columns, and exposing top surfaces of the plurality of second metal connecting columns; S5: patterning a first antenna metal layer on the second packaging layer, wherein the first antenna metal layer is electrically connected to the plurality of second metal connecting columns; S6: forming a plurality of first metal connecting columns on the first antenna metal layer; S7: providing a semiconductor chip, and bonding the semiconductor chip to the second packaging layer with an adhesive layer, wherein the semiconductor chip comprises a chip external port connected to a contact solder pads on the semiconductor chip; S8: depositing a first packaging layer on the first antenna metal layer, the plurality of first metal connecting columns and the semiconductor chip, and exposing top surfaces of the plurality of first metal connecting columns and the chip external port from the first packaging layer; S9: forming a rewiring layer on the first packaging layer, wherein the rewiring layer comprises a first surface and a second surface opposite to the first surface, wherein the second surface is in contact with the first packaging layer, and the rewiring layer is electrically connected to the plurality of first metal connecting columns and the chip external port; S10: forming a plurality of metal bumps on the first surface of the rewiring layer; and S11: removing the separation layer and the supporting substrate.

Optionally, the supporting substrate comprises one of a glass substrate, a metal substrate, a semiconductor substrate, a polymer substrate and a ceramic substrate; the separation layer comprises one of an adhesive tape and a polymer layer, and the polymer layer is cured by ultraviolet.

Optionally, depositing the second packaging layer in step S4 comprises one of compression molding, transfer molding, hydro-forming, vacuum lamination and spin coating; and a depositing the first packaging layer in step S8 comprises one of compression molding, transfer molding, hydro-forming, vacuum lamination and spin coating.

Optionally, forming plurality of the second metal connecting columns in step S3 comprises the following steps: S3-1: forming a second metal connecting block on the second antenna metal layer, where the second metal connecting block is electrically connected to the second antenna metal layer; and S3-2: forming one of the plurality of second metal connecting columns on a top surface of the second metal connecting block by a wire bonding process, wherein the second metal connecting block has a contacting area larger than a contacting area of said second metal connecting column.

Optionally, forming the plurality of the first metal connecting columns in step S6 comprises the following steps: S6-1: forming a first metal connecting block on the first antenna metal layer, where the first metal connecting block is electrically connected to the first antenna metal layer; and S6-2: forming one of the plurality of first metal connecting columns on a top surface of the first metal connecting block by a wire bonding process, wherein the first metal connecting block has a contacting area larger than a contact area of said first metal connecting column.

Optionally, forming the rewiring layer in step S9 comprises the following steps: S9-1: forming a dielectric layer on the first packaging layer by either a physical vapor deposition process or a chemical vapor deposition process, and patterning the dielectric layer; and S9-2: forming a metal wiring layer on the patterned dielectric layer by applying a physical vapor deposition process, a chemical vapor deposition process, an evaporation process, a sputtering process, an electroplating process or a chemical plating process, and patterning the metal wiring layer.

Optionally, step S9 further comprises repeating the step S9-1 and the step S9-2 up to N times, and wherein N is an integer.

DESCRIPTIONS OF REFERENCE NUMERALS

Figure 1:
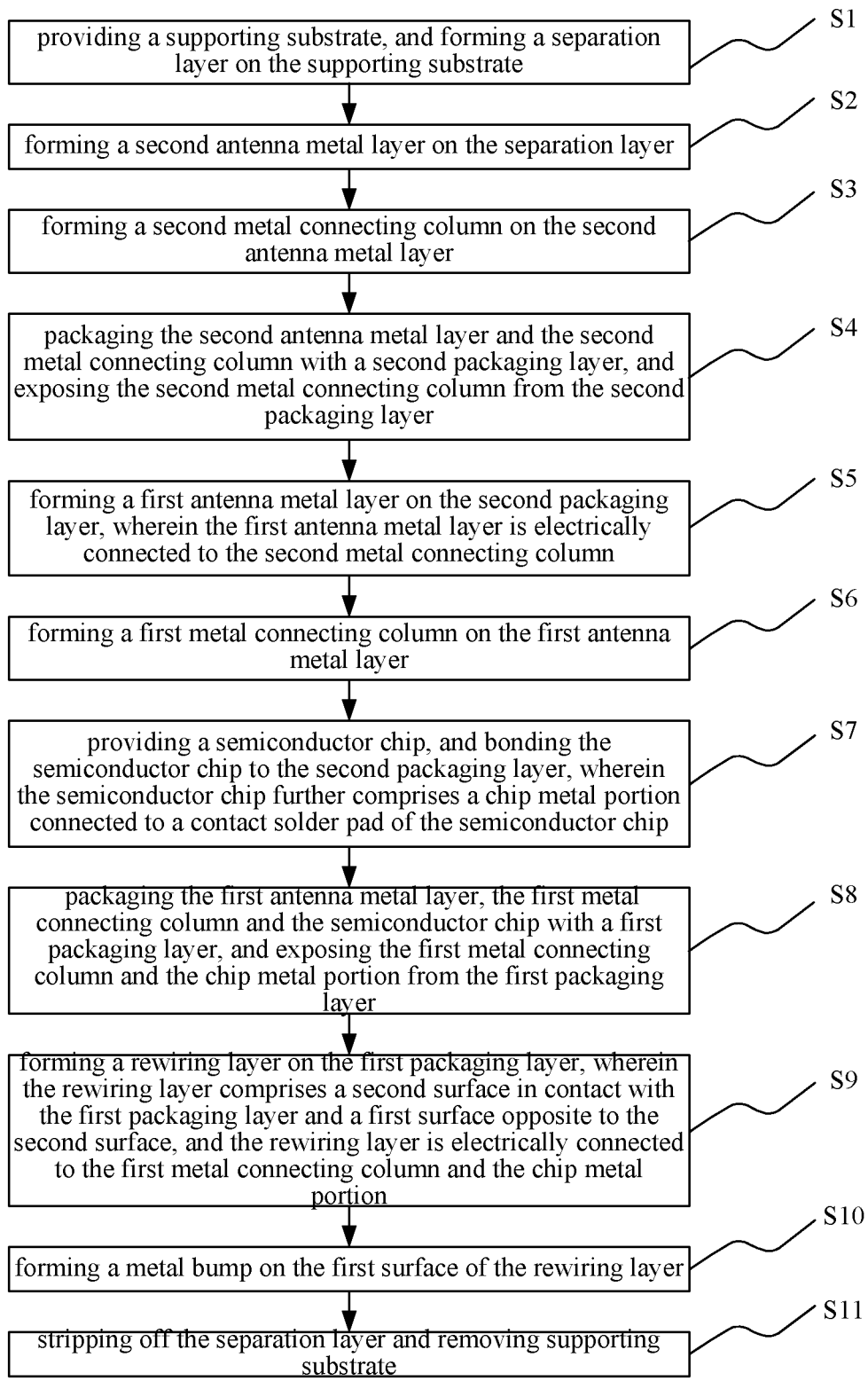
FIG. 1 shows the flowchart of the fabrication method for a fan-out antenna packaging according to the present disclosure.

101 Supporting substrate
102 Separation layer
103 Rewiring layer
113 Dielectric layer
123 Metal wiring layer
104 First metal connecting column
114 First metal connecting block
105 Semiconductor chip
115 Chip metal portion
125 Adhesion layer
106 First packaging layer
107 First antenna metal layer
108 Second metal connecting column
118 Second metal connecting block
109 Second packaging layer
110 Second antenna metal layer
111 Metal bump
S1 to S11 Fabrication Steps

DETAILED DESCRIPTION OF THE PREFERRED EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

Figure 14:
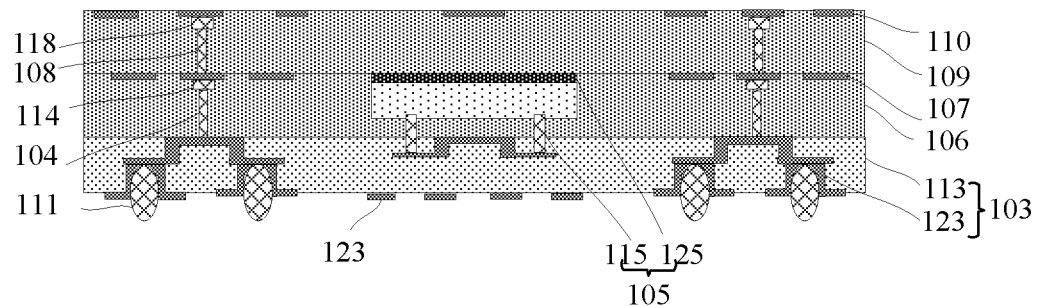
FIG. 14 shows the structural diagram of the completed fan-out antenna packaging structure according to the present disclosure.

As shown in FIG. 14, the present disclosure provides a fan-out antenna packaging structure. The packaging structure comprises: a rewiring layer 103, a first metal connecting column 104, a semiconductor chip 105, a first packaging layer 106, a first antenna metal layer 107, a second metal connecting column 108, a second packaging layer 109, a second antenna metal layer 110 and a metal bump 111.

Specifically, the rewiring layer 103 comprises a first surface, and a second surface opposite to the first surface. The first metal connecting column 104 is disposed on the second surface of the rewiring layer 103 and is electrically connected to the rewiring layer 103. The first antenna metal layer 107 is disposed on and electrically connected to the first metal connecting column 104. The semiconductor chip 105 is disposed on the second surface of the rewiring layer 103 and is electrically connected to the rewiring layer 103. The first packaging layer 106 covers the rewiring layer 103, the first metal connecting column 104, the first antenna metal layer 107 as well as the semiconductor chip 105, the first packaging layer 106 exposes the first antenna metal layer 107 as well as an adhesion layer 125 adhered to the semiconductor chip 105. The second metal connecting column 108 is disposed on and electrically connected to the first antenna metal layer 107. The second antenna metal layer 110 is disposed on and electrically connected to the second metal connecting column 108. The second packaging layer 109 covers the second metal connecting column 108 as well as the second antenna metal layer 110, and exposes the second antenna metal layer 110. The metal bump 111 is disposed on the first surface of the rewiring layer 103 and is electrically connected to the rewiring layer 103. In this embodiment, the rewiring layer 103, the first metal connecting column 104 and the second metal connecting column 108 are used to integrate the first antenna metal layer 107 and the second antenna metal layer 110, thereby improving the efficiency and performance of the antenna as well as the conformity of the antenna packaging structure. The semiconductor chip 105 is disposed in the first packaging layer 106, and the first antenna metal layer 107 is leveled with the adhesion layer 125, thereby further reducing space, so that the volume of the packaging structure is further reduced. The first antenna metal layer 107 is disposed in the first packaging layer 106, and the second antenna metal layer 110 is disposed in the second packaging layer 109 respectively, so that the volume of the packaging structure can be further reduced, and integration as well as packaging performance of the antenna packaging structure can be improved.

In this embodiment, the rewiring layer 103 comprises a patterned dielectric layer 113, and a patterned metal wiring layer 123 disposed on the patterned dielectric layer 113. Further, the dielectric layer 113 comprises one or a combination of an epoxy resin layer, a silica gel layer, a Polyimide (PI) layer, a Polybenzoxazole (PBO) layer, a Benzocyclobutene (BCB) layer, a silicon oxide layer, a phosphorosilicate glass layer, and a fluorine-containing glass layer, and the metal wiring layer 123 comprises one or a combination of a copper layer, an aluminum layer, a nickel layer, a gold layer, a silver layer, and a titanium layer. The specific quantities and types of the dielectric layer 113 and the metal wiring layer 123 in the rewiring layer 103 are not excessively limited herein.

In this embodiment, a first metal connecting block 114 is further provided between the first metal connecting column 104 and the first antenna metal layer 107. Preferably, the first metal connecting column 104 is disposed at a center of symmetry of the first metal connecting block 114, and the first metal connecting block 114 has a cross section larger than that of the first metal connecting column 104, thereby increasing a contact area between the first metal connecting block 114 and the first antenna metal layer 107 to improve electric stability.

As shown in FIG. 14, the first metal connecting column 104 is disposed on the second surface of the rewiring layer 103, and is connected to the first antenna metal layer 107 through the first metal connecting block 114. Further, the first metal connecting column 104 and the first metal connecting block 114 are made of one or a combination of Au, Ag, Cu, and Al, which is not excessively limited herein.

In this embodiment, the semiconductor chip 105 further comprises a chip metal portion 115 connected to a contact solder pad (not shown) of the semiconductor chip 105. The chip metal portion 115 comprises one of a metal column and a metal ball, and the chip metal portion 115 implements electric connection between the semiconductor chip 105 and the rewiring layer 103. The chip metal portion 115 is used as an electric connection end of the semiconductor chip 105, to facilitate process operations and avoid performing a wire bonding process on the contact solder pad of the semiconductor chip 105, thereby improving the stability and yield of the semiconductor chip 105.

As shown in FIG. 14, the chip metal portion 115 includes the metal column having a specific height. The metal column 115 has a height ranging from 25 μm to 250 μm. The metal column is made of one of copper, nickel, tin and silver. The quantity and type of the semiconductor chip 105 are not limited herein.

In this embodiment, lateral surfaces of the chip metal portion 115 are wrapped by the dielectric layer 113 in the rewiring layer 103, so that the electric stability between the semiconductor chip 105 and the rewiring layer 103 can be further improved.

In this embodiment, the adhesion layer 125 adhered to the semiconductor chip 105 is exposed from the first packaging layer 106 and is bonded to the second packaging layer 109. The semiconductor chip 105 is fixed on the second packaging layer 109 through the adhesion layer 125. The adhesion layer 125 includes one of an epoxy resin layer and a polymer film layer, such as a metal DAF film or a metal conductive adhesive.

In this embodiment, the first packaging layer 106 includes one of an epoxy resin layer, a polyimide layer and a silica gel layer. A surface of the first packaging layer 106 in contact with the rewiring layer 103 is a flat surface which has been grinded or polished, to improve the contact performance between the rewiring layer 103 and the first metal connecting column 104 as well as the semiconductor chip 105. The first antenna metal layer 107 may be made of Au, Cu, or the like, and the first antenna metal layer 107 may have various different patterns depending on a performance requirement, which is not limited herein. As shown in FIG. 14, the first antenna metal layer 107 is formed in the first packaging layer 106.

In this embodiment, a second metal connecting block 118 is further provided between the second metal connecting column 108 disposed on the first antenna metal layer 107 and the second antenna metal layer 110, the second metal connecting block 118 has a cross section larger than that of the second metal connecting column 108. Preferably, the second metal connecting column 108 is located at a center of symmetry of the second metal connecting block 118, thereby increasing a contact area between the second metal connecting block 118 and the second antenna metal layer 110 to improve the electric stability. Further, the second metal connecting column 108 and the second metal connecting block 118 are made of one or a combination of Au, Ag, Cu, and Al, which is not excessively limited herein.

In a further embodiment of this embodiment, the second metal connecting column 108 is lower than the first metal connecting column 104, to further reduce the volume of the packaging structure.

Specifically, the second packaging layer 109 comprises one of an epoxy resin layer, a polyimide layer and a silica gel layer. A surface of the second packaging layer 109 in contact with the first packaging layer 106 is a flat surface which has been grinded or polished, to improve the contact performance between the second metal connecting column 108 and the first metal connecting layer 107. The second antenna metal layer 110 may be made of Au, Cu or the like, and the second antenna metal layer 110 may have various different patterns depending on a performance requirement, which is not limited herein. As shown in FIG. 14, the second antenna metal layer 110 is formed in the second packaging layer 109, so that the volume of the packaging structure can be further reduced, and the cleanness as well as electric stability of the packaging structure can be improved.

In this embodiment, the metal bump 111 includes one of a copper bump, a nickel bump, a tin bump and a silver bump. The metal bump 111 may further comprise a columnar metal connected to the metal bump 111, which is not limited herein.

As shown in FIG. 14, the semiconductor chip 105 is electrically connected to the first antenna metal layer 107 and the second antenna metal layer 110 through the rewiring layer 103, the first metal connecting column 104 and the second metal connecting column 108, to implement antenna functions. According to this structure, an antenna packaging structure with more layers can be achieved by using more metal connecting columns, packaging layers and antenna metal layers, which is not limited herein. Therefore, integration of a plurality of antenna metal layers is achieved, thereby greatly improving the efficiency and performance of an antenna and further improving the conformity of the antenna packaging structure. The packaging volume is reduced so that the antenna packaging structure has a higher level of integration.

As shown in FIG. 1, this embodiment further provides a fan-out antenna packaging method, comprising the following steps:

S1: Providing a supporting substrate, and forming a separation layer on the supporting substrate.

S2: Forming a second antenna metal layer on the separation layer.

S3: Forming a second metal connecting column on the second antenna metal layer.

S4: Packaging the second antenna metal layer and the second metal connecting column by using a second packaging layer, and exposing the second metal connecting column from the second packaging layer.

S5: Forming a first antenna metal layer on the second packaging layer, where the first antenna metal layer is electrically connected to the second metal connecting column.

S6: Forming a first metal connecting column on the first antenna metal layer.

S7: Providing a semiconductor chip, and bond the semiconductor chip to the second packaging layer, where the semiconductor chip further comprises a chip metal portion connected to a contact solder pad of the semiconductor chip.

S8: Packaging the first antenna metal layer, the first metal connecting column and the semiconductor chip with a first packaging layer, and exposing the first metal connecting column and the chip metal portion from the first packaging layer.

S9: Forming a rewiring layer on the first packaging layer, where the rewiring layer comprises a second surface in contact with the first packaging layer and a first surface opposite to the second surface, and the rewiring layer is electrically connected to the first metal connecting column and the chip metal portion.

S10: Forming a metal bump on the first surface of the rewiring layer.

S11: Stripping off the separation layer and removing the supporting substrate.

Specifically, in this embodiment, the first packaging layer can be used to package the semiconductor chip while packaging the first metal connecting column and the first antenna metal layer, thereby improving the stability of the semiconductor chip and reducing costs. The first metal connecting column is formed before bonding of the semiconductor chip, so that a bonding surface between the first metal connecting column and the first antenna metal layer is cleaner, and the stability of the first metal connecting column can be improved. The rewiring layer is directly formed on the first packaging layer, so that electric connections to the first metal connecting column and the semiconductor chip are implemented at the same time, thereby reducing the process complexity. The first antenna metal layer is disposed in the first packaging layer, the second antenna metal layer is disposed in the second packaging layer, to further reduce the volume of the packaging structure. Moreover, based on the separation layer is stripped off, and the supporting substrate is removed in the last step, thereby improving the cleanness and electric stability of the packaging structure. A fan-out packaging method is used to package an antenna structure, which can effectively reduce the packaging volume, so that the antenna packaging structure achieves a higher level of integration and better packaging performance FIGS. 2 to 14 show structural diagrams after each step in fabricating method of the antenna packaging according to the present disclosure.

Figure 2:
FIGS. 2 to 13 show the structural diagrams after each step in fabricating the antenna packaging according to the present disclosure.

As shown in FIG. 2, step S1 is first performed to provide a supporting substrate 101 and form a separation layer 102 on the supporting substrate 101.

In this embodiment, the supporting substrate 101 includes one of a glass substrate, a metal substrate, a semiconductor substrate, a polymer substrate and a ceramic substrate. In this embodiment, the supporting substrate 101 is preferably a glass substrate. The glass substrate is low in cost, and the separation layer 102 can be easily formed on the glass substrate. Moreover, the glass substrate can reduce the difficulty of a subsequent stripping process.

In this embodiment, the separation layer 102 includes either an adhesive tape or a polymer layer. The polymer layer is first coated on the surface of the supporting substrate 101 by using a spin coating process, and then is cured by ultraviolet curing or thermal curing.

Specifically, in this embodiment, a polymer layer of an LTHC photothermal conversion layer is used as the separation layer 102, so that the LTHC photothermal conversion layer can be heated by using laser in the subsequent step S11 to separate the supporting substrate 101 from the LTHC photothermal conversion layer.

Figure 3:
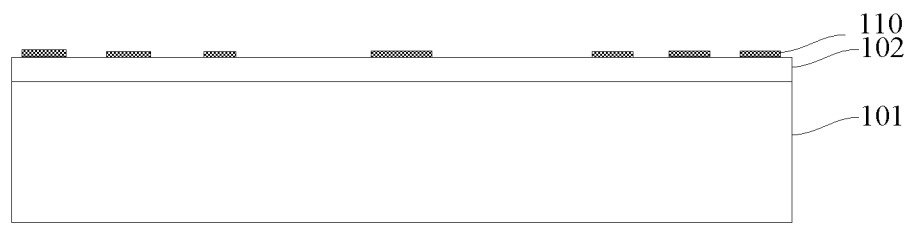

As shown in FIG. 3, step S2 is then performed to form a second antenna metal layer 110 on the separation layer 102.

Specifically, the second antenna metal layer 110 can be formed on the separation layer 102 by using a physical vapor deposition process, a chemical vapor deposition process, an evaporation process, a sputtering process, an electroplating process or a chemical plating process, and then the second antenna metal layer 110 is patterned by using an etching process.

Figure 4:
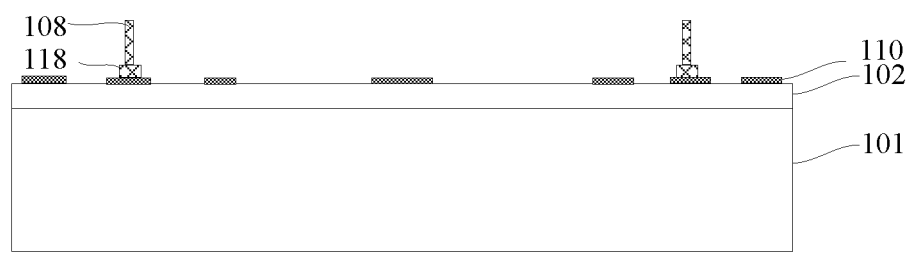

As shown in FIG. 4, step S3 is then performed to form a second metal connecting column 108 on the second antenna metal layer 110, where the second metal connecting column 108 is electrically connected to the second antenna metal layer 110.

In this embodiment, forming the second metal connecting column 108 in step S3 comprises the following steps:

S3-1: Forming a second metal connecting block 118 on the second antenna metal layer 110, where the second metal connecting block 118 is electrically connected to the second antenna metal layer 110.

S3-2: Forming the second metal connecting column 108 on a top surface of the second metal connecting block 118 by using a wire bonding process, where the second metal connecting block 118 has a cross section larger than that of the second metal connecting column 108. Preferably, the second metal connecting column 108 is disposed at a center of symmetry of the second metal connecting block 118, thereby increasing a contact area between the second metal connecting block 118 and the second antenna metal layer 110 to improve the electric stability.

Specifically, the wire bonding process comprises one of a hot-pressing wire bonding process, an ultrasonic wire bonding process and a hot-pressing ultrasonic wire bonding process. The second metal connecting column 108 and the second metal connecting block 118 are made of one or a combination of Au, Ag, Cu, and Al.

Figure 5:
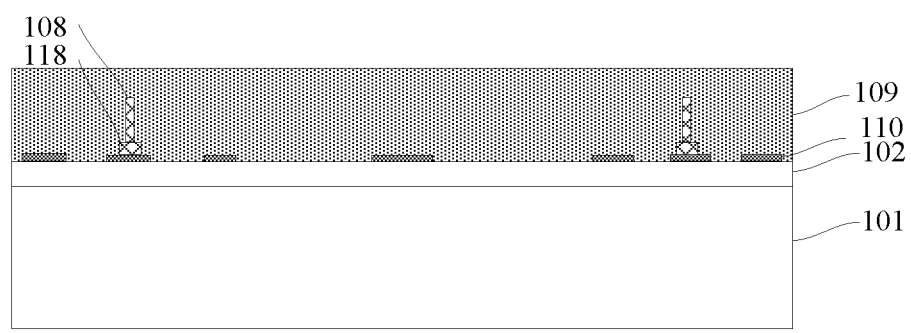
Figure 6:
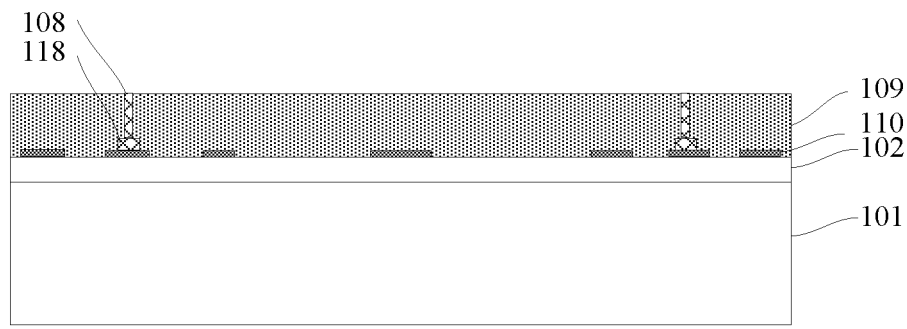

As shown in FIG. 5 and FIG. 6, step S4 is then performed to package the second antenna metal layer 110 and the second metal connecting column 108 with the second packaging layer 109, and expose the second metal connecting column 108 from the second packaging layer 109.

In this embodiment, forming the second packaging layer 109 in step S4 includes one of compression molding, transfer molding, hydro-forming, vacuum lamination and spin coating, and the second packaging layer 109 is made of one of polyimide, silica gel and epoxy resin.

Specifically, after the second packaging layer 109 is formed, the method further comprises grinding or polishing the surface of the second packaging layer 109, so that the second packaging layer 109 provided is flat, thereby enhancing the electric connection between the subsequently formed first antenna metal layer 107 and the second metal connecting column 108.

Figure 7:
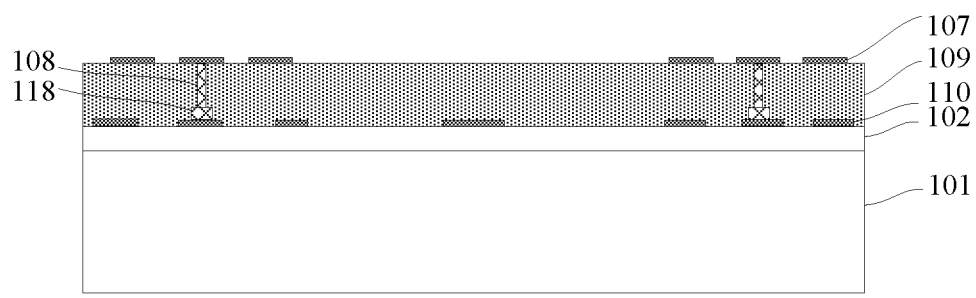

As shown in FIG. 7, step S5 is then performed to form a first antenna metal layer 107 on the second packaging layer 109, where the first antenna metal layer 107 is electrically connected to the second metal connecting column 108.

Specifically, the first antenna metal layer 107 can be formed on the second packaging layer 109 by using a physical vapor deposition process, a chemical vapor deposition process, an evaporation process, a sputtering process, an electroplating process or a chemical plating process, and then the first antenna metal layer 107 is patterned by using an etching process.

Figure 8:
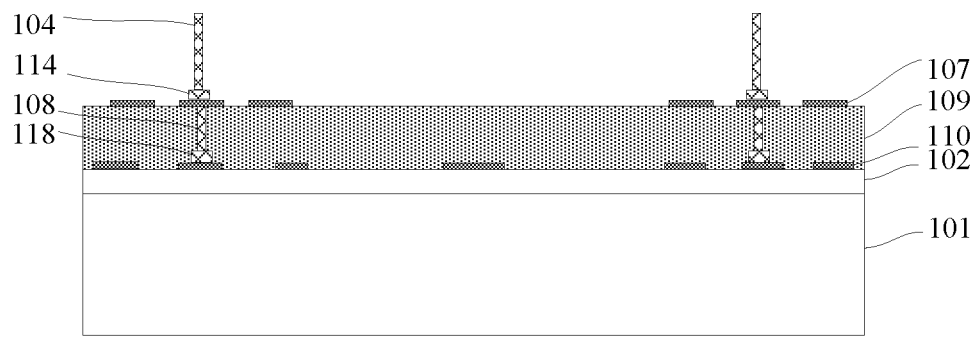

As shown in FIG. 8, step S6 is then performed to form a first metal connecting column 104 on the first antenna metal layer 107, where the first metal connecting column 104 is electrically connected to the first antenna metal layer 107.

In a further embodiment of this embodiment, forming the first metal connecting column 104 in step S6 comprises the following steps:

S6-1: Forming a first metal connecting block 114 on the first antenna metal layer 107, where the first metal connecting block 114 is electrically connected to the first antenna metal layer 107.

S6-2: Forming the first metal connecting column 104 on a top surface of the first metal connecting block 114 by using a wire bonding process, where the first metal connecting block 114 has a cross section area larger than that of the first metal connecting column 104. Preferably, the first metal connecting column 104 is disposed at a center of symmetry of the first metal connecting block 114, thereby increasing a contact area between the first metal connecting block 114 and the first antenna metal layer 107 to improve the electric stability.

Figure 9:
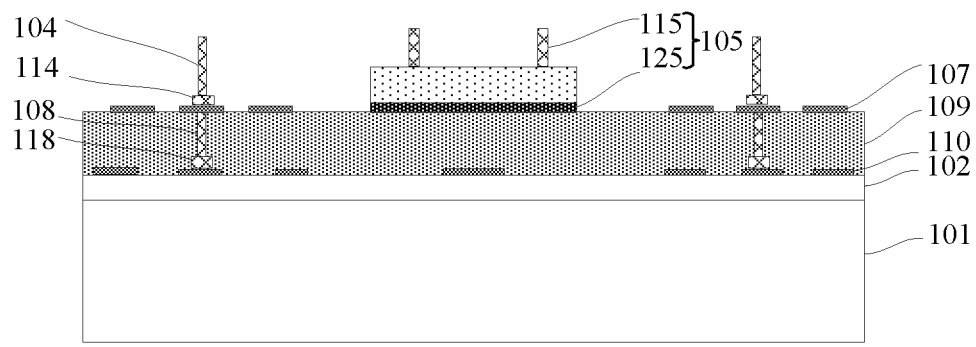

As shown in FIG. 9, step S7 is then performed to provide a semiconductor chip 105 and bond the semiconductor chip 105 to the second packaging layer 109, where the semiconductor chip 105 further includes a chip metal portion 115 connected to a contact solder pad of the semiconductor chip 105.

Specifically, the chip metal portion 115 comprises one of a metal column and a metal ball having a specific height, and the chip metal portion 115 is used as an electric connection end of the semiconductor chip 105, to facilitate process operations and avoid performing a wire bonding process on the contact solder pad of the semiconductor chip 105, thereby improving the stability and yield of the semiconductor chip 105. The chip metal portion 115 is made of one of copper, nickel, tin and silver. In this embodiment, the chip metal portion 115 uses the metal column, and metal column has a height ranging from 25 μm to 250 μm. The quantity and type of the semiconductor chip 105 are not limited herein.

In this embodiment, the semiconductor chip 105 is adhered on the surface of the second packaging layer 109 through an adhesion layer 125, and the adhesion layer 125 includes one of an epoxy resin layer and a polymer film layer, such as a metal DAF film or a metal conductive adhesive.

Figure 10:
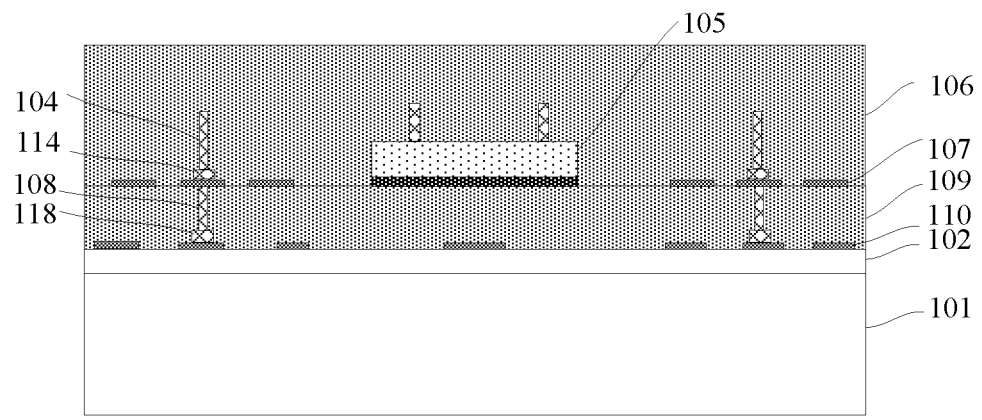
Figure 11:
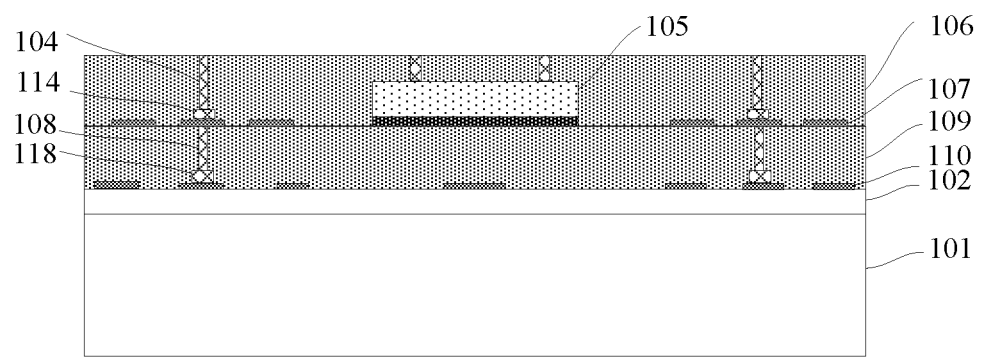

As shown in FIG. 10 and FIG. 11, step S8 is then performed to package the first antenna metal layer 107, the first metal connecting column 104 and the semiconductor chip 105 with a first packaging layer 106, and expose the first metal connecting column 104 and the chip metal portion 115 from the first packaging layer 106.

In this embodiment, forming the first packaging layer 106 in step S8 comprises one of compression molding, transfer molding, hydro-forming, vacuum lamination and spin coating, and the first packaging layer 106 is made of one of polyimide, silica gel and epoxy resin.

Specifically, after the first packaging layer 106 is formed, the method further comprises grinding or polishing the surface of the first packaging layer 106, so that the provided first packaging layer 106 is flat, thereby enhancing the electric connection between the subsequently formed rewiring layer 103 and the first metal connecting column 104 as well as the chip metal portion 115.

Figure 12:
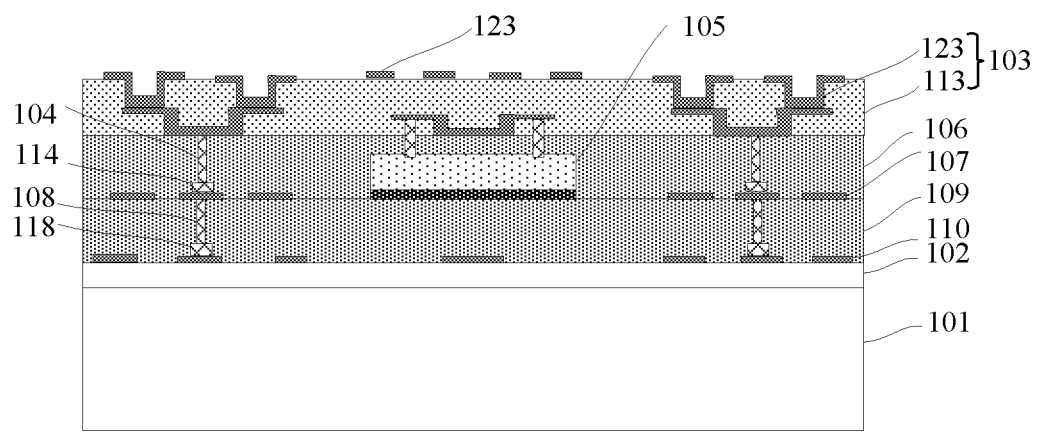

As shown in FIG. 12, step S9 is then performed to form a rewiring layer 103 on the surface of the first packaging layer 106, where the rewiring layer 103 comprises a second surface in contact with the first packaging layer 106 and a first surface opposite to the second surface, and the rewiring layer 103 is electrically connected to the first metal connecting column 104 and the chip metal portion 115.

In a further embodiment of this embodiment, forming the rewiring layer 103 in step S9 comprises the following steps:

S9-1: Forming a dielectric layer 113 on the first packaging layer 106 by using a physical vapor deposition process or a chemical vapor deposition process, and etching the dielectric layer 113 to form a patterned dielectric layer 113.

S9-2: Forming a metal wiring layer 123 on the surface of the patterned dielectric layer 113 by using a physical vapor deposition process, a chemical vapor deposition process, an evaporation process, a sputtering process, an electroplating process or a chemical plating process, and etching the metal wiring layer 123 to form a patterned metal wiring layer 123.

In embodiment, step S9 may further comprise repeating the step S9-1 and the step S9-2 up to N times, and wherein N is an integer.

In this embodiment, lateral surfaces of the chip metal portion 115 are wrapped by the dielectric layer 113 in the rewiring layer 103, so that the electric stability between the semiconductor chip 105 and the rewiring layer 103 is further improved.

Figure 13:
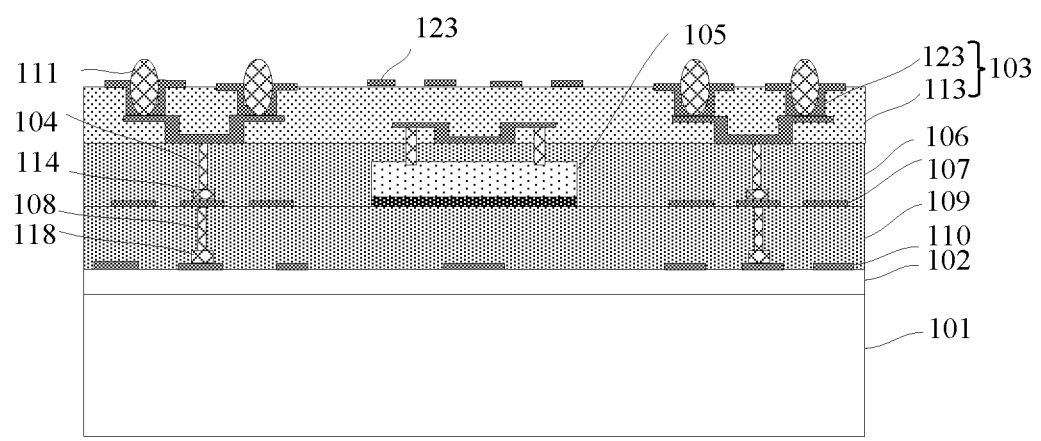

As shown in FIG. 13, step S10 is then performed to form a metal bump 111 on the first surface of the rewiring layer 103.

Specifically, the metal bump 111 is formed on the metal wiring layer 123 on the packaging structure obtained in step S9. The metal bump 111 comprises one of a tin solder, a silver solder, and a gold-tin alloy solder. The metal bump 111 may further include a columnar metal connected to the metal bump 111, and the rewiring layer 103 may include a plurality of patterned dielectric layers 113 and patterned metal wiring layers 123, which is not limited herein.

As shown in FIG. 14, step S11 is then performed to strip off the separation layer 102, and remove the supporting substrate 101.

Specifically, the LTHC photothermal conversion layer is heated by using laser to separate the supporting substrate 101 from the LTHC photothermal conversion layer.

In conclusion, the fan-out antenna packaging structure and packaging method according to the present disclosure has the following beneficial effects:

1) The present disclosure achieves integration of a plurality of antenna metal layers by using a rewiring layer and metal connecting columns, thereby greatly improving the efficiency and performance of an antenna and improving the conformity of an antenna packaging structure.

2) In the present disclosure, the semiconductor chip is disposed in the packaging layer, and the antenna metal layer is leveled with the adhesion layer adhered to the semiconductor chip, thereby reducing space so that the packaging structure becomes smaller. The packaging layers are used to package the semiconductor chip while packaging the metal connecting columns and the antenna metal layers, thereby improving the stability of the semiconductor chip and reducing costs.

3) In the present disclosure, a metal connecting column is formed before bonding of the semiconductor chip, so that a bonding surface between the metal connecting column and the rewiring layer is cleaner, thereby improving the stability of the metal connecting columns.

4) In the present disclosure, the rewiring layer is directly formed on the packaging layer, so that electric connections to the metal connecting column and the semiconductor chip are implemented at the same time, thereby reducing process complexity.

5) In the present disclosure, antenna metal layers are in the packaging layers, so as to further reduce the volume of the packaging structure; moreover, the separation layer is stripped off and the supporting substrate is removed in the last step, thereby improving the cleanness and electric stability of the packaging structure.

6) In the present disclosure, a fan-out packaging method is used to package an antenna structure, which can effectively reduce the packaging area and volume, to enable the antenna packaging structure with a higher level of density, integration and better packaging performance, therefore the technique is promising with new application prospect in the field of semiconductor packaging.

The present disclosure effectively overcomes various disadvantages in the prior arts and hence has high industrial usage value. The foregoing embodiments only illustrate the principle and efficacy of the present disclosure exemplarily, and are not meant to limit variations of the technique. Any person skilled in the art can make modifications on the foregoing embodiments without departing from the spirit and scope of the present disclosure. Accordingly, all equivalent modifications or variations completed by those with ordinary skill in the art without departing from the spirit and technical thinking disclosed by the present disclosure should fall within the scope of claims of the present disclosure.

The invention claimed is:

1. A method of fabricating a fan-out antenna for a semiconductor chip, comprising the following steps:
   S1: providing a supporting substrate, and forming a separation layer on the supporting substrate;
   S2: forming a second antenna metal layer on the separation layer;
   S3: forming a plurality of second metal connecting columns on the second antenna metal layer;
   S4: depositing a second packaging layer on the second antenna metal layer and the plurality of second metal connecting columns, and exposing top surfaces of the plurality of second metal connecting columns;
   S5: patterning a first antenna metal layer on the second packaging layer, wherein the first antenna metal layer is electrically connected to the plurality of second metal connecting columns;
   S6: forming a plurality of first metal connecting columns on the first antenna metal layer;
   S7: providing a semiconductor chip, and bonding the semiconductor chip to the second packaging layer with an adhesive layer, wherein the semiconductor chip comprises a chip external port connected to a contact solder pads on the semiconductor chip;
   S8: depositing a first packaging layer on the first antenna metal layer, the plurality of first metal connecting columns and the semiconductor chip, and exposing top surfaces of the plurality of first metal connecting columns and the chip external port from the first packaging layer;
   S9: forming a rewiring layer on the first packaging layer, wherein the rewiring layer comprises a first surface and a second surface opposite to the first surface, wherein the second surface is in contact with the first packaging layer, and the rewiring layer is electrically connected to the plurality of first metal connecting columns and the chip external port;
   S10: forming a plurality of metal bumps on the first surface of the rewiring layer; and
   S11: removing the separation layer and the supporting substrate.

2. The method of fabricating a fan-out antenna for a semiconductor chip according to claim 1, wherein the supporting substrate comprises one of a glass substrate, a metal substrate, a semiconductor substrate, a polymer substrate and a ceramic substrate; wherein the separation layer comprises one of an adhesive tape and a polymer layer, and wherein the polymer layer is cured by ultraviolet or heat.

3. The method of fabricating a fan-out antenna for a semiconductor chip according to claim 1, wherein depositing the second packaging layer in step S4 comprises one of compression molding, transfer molding, hydro-forming, vacuum lamination and spin coating; and wherein depositing the first packaging layer in step S8 comprises one of compression molding, transfer molding, hydro-forming, vacuum lamination and spin coating.

4. The method of fabricating a fan-out antenna for a semiconductor chip according to claim 1, wherein forming the plurality of second metal connecting columns in step S3 comprises the following steps:
  S3-1: forming a second metal connecting block on the second antenna metal layer, wherein the second metal connecting block is electrically connected to the second antenna metal layer; and
  S3-2: forming one of the plurality of second metal connecting columns on a top surface of the second metal connecting block by a wire bonding process, wherein the second metal connecting block has a contacting area larger than a contacting area of said second metal connecting column.

5. The method of fabricating a fan-out antenna for a semiconductor chip according to claim 1, wherein forming the plurality of first metal connecting columns in step S6 comprises the following steps:
  S6-1: forming a first metal connecting block on the first antenna metal layer, wherein the first metal connecting block is electrically connected to the first antenna metal layer; and
  S6-2: forming one of the plurality of first metal connecting columns on a top surface of the first metal connecting block by a wire bonding process, wherein the first metal connecting block has a contacting area larger than a contact area of said first metal connecting column.

6. The method of fabricating a fan-out antenna for a semiconductor chip according to claim 1, wherein forming the rewiring layer in step S9 comprises the following steps:
  S9-1: forming a dielectric layer on the first packaging layer by either a physical vapor deposition process or a chemical vapor deposition process, and patterning the dielectric layer; and
  S9-2: forming a metal wiring layer on the patterned dielectric layer by applying a physical vapor deposition process, a chemical vapor deposition process, an evaporation process, a sputtering process, an electroplating process or a chemical plating process, and patterning the metal wiring layer.

7. The method of fabricating a fan-out antenna for a semiconductor chip according to claim 6, wherein step S9 further comprises repeating the step S9-1 and the step S9-2 up to N times, and wherein N is an integer.

* * * * *